(12) United States Patent
Lee et al.

(10) Patent No.: US 9,786,384 B2
(45) Date of Patent: Oct. 10, 2017

(54) DISPLAY DEVICE

(71) Applicant: Samsung Display Co., Ltd., Yongin, Gyeonggi-do (KR)

(72) Inventors: In Soo Lee, Seongnam-si (KR); Dong Hwan Lee, Yongin-si (KR); Seung Kyun Hong, Cheonan-si (KR); So Young Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 80 days.

(21) Appl. No.: 14/308,670

(22) Filed: Jun. 18, 2014

(65) Prior Publication Data
US 2015/0170568 A1  Jun. 18, 2015

(30) Foreign Application Priority Data

Dec. 17, 2013 (KR) .......................... 10-2013-0157631

(51) Int. Cl.
| | |
|---|---|
| *G09G 3/32* | (2016.01) |
| *G11C 19/28* | (2006.01) |
| *G09G 3/3233* | (2016.01) |
| *G09G 3/3266* | (2016.01) |

(52) U.S. Cl.
CPC ......... *G11C 19/287* (2013.01); *G09G 3/3233* (2013.01); *G09G 3/3266* (2013.01); *G09G 2300/0861* (2013.01); *G09G 2310/0267* (2013.01); *G09G 2310/0286* (2013.01)

(58) Field of Classification Search
None
See application file for complete search history.

(56) References Cited

U.S. PATENT DOCUMENTS

2012/0050234 A1* 3/2012 Jang ..................... G09G 3/3225
345/204

FOREIGN PATENT DOCUMENTS

| KR | 10-2006-0056787 A | 5/2006 |
|---|---|---|
| KR | 10-2008-0082066 A | 9/2008 |
| KR | 10-0962909 B1 | 6/2010 |
| KR | 10-2012-0062493 A | 6/2012 |

* cited by examiner

*Primary Examiner* — Seokyun Moon
*Assistant Examiner* — Douglas Wilson
(74) *Attorney, Agent, or Firm* — Lewis Roca Rothgerber Christie LLP

(57) ABSTRACT

Disclosed is a display device including a light emission driver configured to sequentially generate a plurality of light emission signals having a disable level during a first period; and a scan driver configured to generate a plurality of shift outputs each having two enable pulses, and each outputting two scan signals, in response to two light emission signals among the plurality of light emission signals, by dividing the two enable pulses of a first shift output among the plurality of shift outputs, which correspond to the two light emission signals among the plurality of light emission signals, from each other.

24 Claims, 9 Drawing Sheets

DISPLAY DEVICE

CROSS-REFERENCE TO RELATED APPLICATION

This application claims priority to and the benefit of Korean Patent Application No. 10-2013-0157631 filed in the Korean Intellectual Property Office on Dec. 17, 2013, the entire contents of which are incorporated herein by reference.

BACKGROUND

1. Field

Embodiments of the present invention relate to a display device. More particularly, embodiments of the present invention relate to a display device including a scan driver and a light emission driver.

2. Description of the Related Art

A high-definition display device includes a plurality of scan lines, and a scan driver circuit for driving the plurality of scan lines has a large size. A higher picture quality of the display device may require a greater number of scan lines, and thus the scan driver circuit may be larger.

The larger the area occupied by the scan driver circuit compared to the whole size of the display device, the larger a dead space area including the scan driver circuit may be.

The above information disclosed in this Background section is only for enhancement of understanding of the background of the invention and therefore it may contain information that does not form the prior art that is known to a person of ordinary skill in the art.

SUMMARY

An exemplary embodiment of the present invention provides a display device including: a light emission driver configured to sequentially generate a plurality of light emission signals having a disable level during a first period; and a scan driver configured to generate a plurality of shift outputs each having two enable pulses, and each outputting two scan signals, in response to first and second light emission signals among the plurality of light emission signals, by dividing two enable pulses of a first shift output among the plurality of shift outputs, which correspond to the first and second light emission signals among the plurality of light emission signals, from each other.

The scan driver may include: a shift register unit which may include a plurality of shift registers configured to generate the plurality of shift outputs, respectively; and a demultiplexer which may include a plurality of switches, which are coupled to the plurality of shift outputs, wherein a third switch among the plurality of switches, which corresponds to the first shift output, is controlled by the second light emission signal, and a fourth switch among the plurality of switches, which corresponds to the first shift output, is controlled by the first light emission signal.

Here, a first shift register, among the plurality of shift registers, may output the first shift output in response to a second shift output of a second shift register, wherein the first shift output may include two enable pulses synchronized with a first scan clock signal which may include two periodic enable pulses, wherein the two enable pulses of the second shift output are synchronized with a second scan clock signal which may include two periodic enable pulses, and wherein the second shift register may be located two stages before the first shift register.

The first scan clock signal and the second scan clock signal may have a half-period phase difference therebetween.

The first shift register may include: a first transistor which may include a first terminal coupled to the second shift output and a gate coupled to the second scan clock signal; a second transistor which may include a gate coupled to a second terminal of the first transistor, a first terminal coupled to the first scan clock signal, and a second terminal coupled to an output terminal of the first shift register; and a capacitor coupled between the gate and the second terminal of the second transistor.

The first shift register may further include: a third transistor which may include a first terminal coupled to a first voltage and a second terminal coupled to the output terminal of the first shift register; and a fourth transistor which may include a first terminal coupled to a gate of the third transistor, a gate coupled to the second shift output, and a second terminal coupled to the first voltage.

The first shift register may further include: a fifth transistor which may include a first terminal coupled to the gate of the third transistor, a gate coupled to a first initialization signal, and a second terminal coupled to a second voltage; and a sixth transistor which may include a first terminal coupled to the first voltage and a second terminal coupled to the gate of the second transistor, and a gate coupled to the gate of the third transistor, wherein the first initialization signal has an enable pulse generated after the two enable pulses of the first scan clock signal and before the two enable pulses of the second scan clock signal.

Here, during a period when the fourth switch is turned off by a disable level of the first light emission signal, a first enable pulse of the two enable pulses of the first shift output is output as a first scan signal through the third switch, and wherein, during a period when the third switch is turned off by a disable level of the second light emission signal, a second enable pulse of the two enable pulses of the first shift output is output as a second scan signal through the fourth switch.

The disable level of the first light emission signal and a the disable level of the second light emission signal do not overlap each other, and wherein the light emission driver generates a third light emission signal having a disable-level overlapping the disable level of the first light emission signal and the disable level.

A third shift register a stage after the first shift register among the plurality of shift registers is configured to output a third shift output in response to a fourth shift output of a fourth shift register, wherein the fourth shift output may include two enable pulses synchronized with a third scan clock signal which may include two periodic enable pulses, wherein the third shift output is synchronized with a fourth scan clock signal having two periodic enable pulses, and wherein the fourth shift register is two stages before the third shift register.

The third scan clock signal and the fourth scan clock signal may have a half-period phase difference therebetween.

The first scan clock and the fourth scan clock may have a ⅛-period phase difference therebetween, and the second scan clock signal and the third scan clock signal may have a ⅛-period phase difference therebetween.

The scan driver may be configured to output third and fourth scan signals in response to third and fourth light emission signals among the plurality of light emission signals, by dividing two enable pulses of the third shift output from each other.

A fifth switch among the plurality of switches, which corresponds to the third shift output, is controlled by the fourth light emission signal, and a sixth switch among the plurality of switches, which corresponds to the third shift output, is controlled by the third light emission signal.

During a period when the sixth switch is turned off by a disable level of the third light emission signal, one pulse of the two enable pulses of the third shift output is output as the third scan signal through the fifth switch, and wherein, during a period when the fifth switch is turned off by a disable level of the fourth light emission signal, the other pulse of the two enable pulses of the third shift output is output as the fourth scan signal through the sixth switch.

The disable level of the third light emission signal and the disable level of the fourth light emission signal do not overlap each other, and wherein the light emission driver generates the first light emission signal having a disable level overlapping the disable level of the third light emission signal and the disable level of the fourth light emission signal.

The first, second, third, and fourth light emission signals have disable levels that occur in order of first, fourth, second, and then third.

The light emission driver may include a first light emission shift register, and a second light emission shift register being one stage before the first light emission shift register, wherein when the first light emission shift register receives a second light emission shift output of the second light emission shift register at an enable level concurrently with a first light emission clock signal having an enable level, the first light emission shift register is configured to output a first light emission shift output at a disable level, and wherein when the first light emission shift register receives a first inverted light emission clock signal at an enable level concurrently with the second light emission shift output at an enable level, the first light emission shift register is configured to output the first light emission shift output at an enable level.

The light emission driver may further include a third light emission shift register, wherein when the third light emission shift register receives the first light emission shift output at an enable level concurrently with a second light emission clock signal having an enable level, the third light emission shift register is configured to output a third light emission shift output at a disable level, and wherein when the third light emission shift register receives a second inverted light emission clock signal at an enable level concurrently with the first light emission shift output at an enable level, the third light emission shift register is configured to output the third light emission shift output at an enable level.

The first light emission clock signal and the second light emission clock signal may have a ¼-period phase difference therebetween.

The first light emission shift register may include: a seventh transistor which may include a gate to which the first light emission clock signal is input, and a first terminal coupled to the second light emission shift output; an eighth transistor which may include a gate coupled to a second terminal of the seventh transistor, and a first terminal coupled to the first inverted light emission clock signal; a ninth transistor which may include a first terminal coupled to the second terminal of the eighth transistor, a gate coupled to the first light emission shift output, and a second terminal coupled to a first voltage; a first capacitor coupled between the gate and the second terminal of the eighth transistor; a tenth transistor which may include a gate coupled to the second terminal of the eighth transistor and a first terminal coupled to a second voltage; and an eleventh transistor which may include a gate coupled to the second terminal of the tenth transistor, a first terminal coupled to the first voltage, and a second terminal coupled to an output terminal of the first light emission shift register.

Here, a gate voltage of the eleventh transistor may be coupled to the first light emission shift output.

The second light emission shift register may further include: a twelfth transistor which may include a gate coupled to the second terminal of the eighth transistor and a first terminal coupled to the first voltage; and a thirteenth transistor which may include a gate coupled to the first light emission clock signal, a first terminal coupled to a second terminal of the twelfth transistor, and a second terminal coupled to the second voltage; a fourteenth transistor which may include a gate coupled to the second terminal of the twelfth transistor, a first terminal coupled to the second voltage, and a second terminal coupled to the output terminal of the first light emission shift register; and a second capacitor coupled between the gate and the second terminal of the fourteenth transistor.

The second light emission shift register may further include: a fifteenth transistor which may include a first terminal coupled to the first voltage, a second terminal coupled to the gate of the eleventh transistor, and a gate coupled to the second terminal of the thirteenth transistor.

According to an embodiment of the present invention, a display device having a scan driver circuit with a decreased size can be provided.

BRIEF DESCRIPTION OF THE DRAWINGS

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
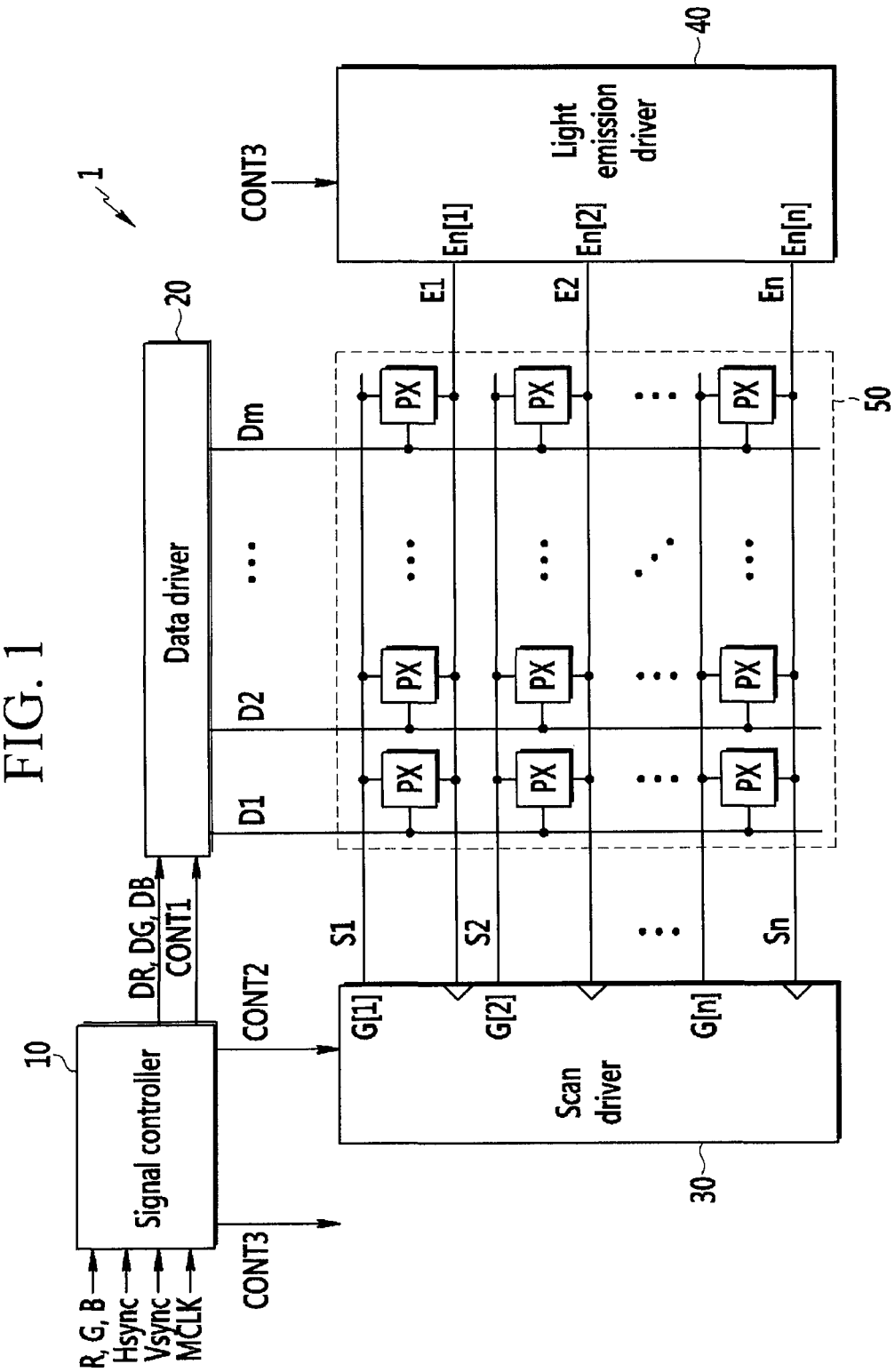
FIG. 1 is a block diagram of a display device according to an example embodiment.

Hereinafter certain example embodiments have been shown and described, simply by way of illustration. As those skilled in the art would realize, the described embodiments may be modified in various different ways, all without departing from the spirit or scope of embodiments of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Expressions such as "at least one of," when preceding a list of elements, modify the entire list of elements and do not modify the individual elements of the list. Further, the use of "may" when describing embodiments of the present invention refers to "one or more embodiments of the present invention."

FIG. 1 is a block diagram of a display device according to an example embodiment.

Referring in FIG. 1, a display device 1 includes a signal controller 10, a data driver 20, a scan driver 30, a light emission driver 40, and a display unit 50.

The signal controller 10 generates a data control signal CONT1, a scan control signal CONT2, and a light emission control signal CONT3 in response to input control signals. The input control signals include a vertical synchronization signal Vsync, a horizontal synchronization signal Hsync, a main clock signal MCLK, and the like.

The signal controller 10 processes input image signals (R, G, and B) by the frame unit in synchronization with the vertical synchronization signal Vsync, and processes the input image signals (R, G, and B) by the row unit (e.g., row-by-row) in synchronization with the horizontal synchronization signal Hsync, thereby arranging image data signals (DR, DG, and DB). The signal controller 10 transmits the scan control signal CONT2 to the scan driver 30, the data control signal CONT1 and the image data signals (DR, DG, and DB) to the data driver 20, and the light emission control signal CONT3 to the light emission driver 40.

The data driver 20 generates a plurality of data signals corresponding to the image data signals (DR, DG, and DB), and transmits the data signals to a plurality of data lines D1~Dm in response to the data control signal CONT1. The light emission driver 40 generates a plurality of light emitting signals EM[1]~EM[n], and transmits the light emitting signals to a plurality of light emission control lines E1~En. The scan driver 30 generates a plurality of scan signals G[1]~G[n] in response to the scan control signal CONT2 and the plurality of light emitting signals EM[1]~EM[n], and transmits the scan signals to the plurality of scan lines S1-Sn.

The display unit 50 includes the plurality of data lines D1~Dm arranged along in a row direction, the plurality of scan lines S1~Sn arranged along in a column direction, the plurality of light emission lines E1~En e arranged along in parallel with the plurality of scan lines S1~Sn, and a plurality of pixels PX. The plurality of data lines D1~Dm, the plurality of scan lines S1~Sn, and the plurality of light emission lines E1~En are coupled to the plurality of pixels PX.

Hereinafter, the scan driver 30 according to embodiments of the present invention will be described with reference to FIGS. 2 and 3.

Figure 2:
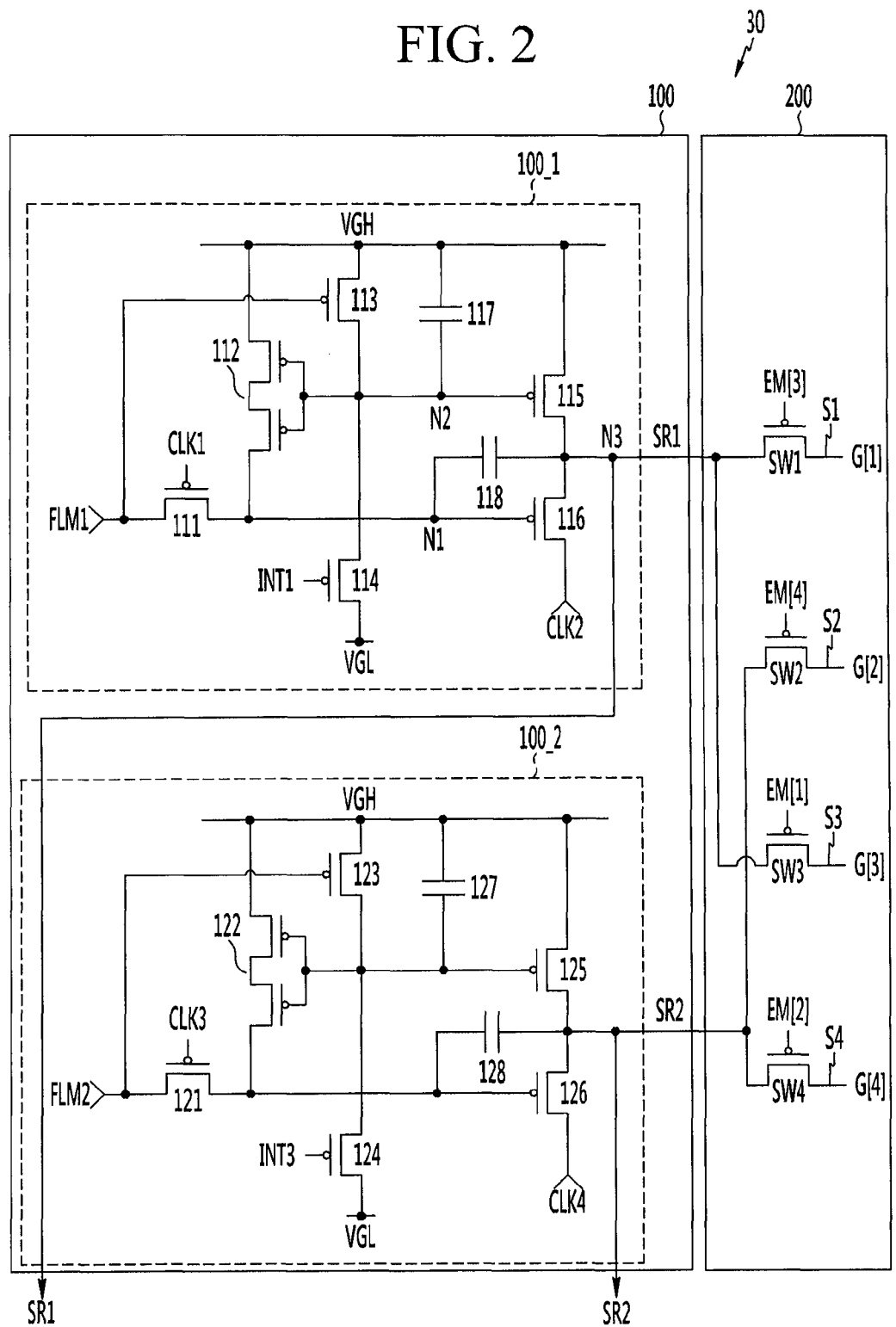
FIGS. 2 and 3 are circuit diagrams of a scan driver according to another example embodiment of the invention.
Figure 3:
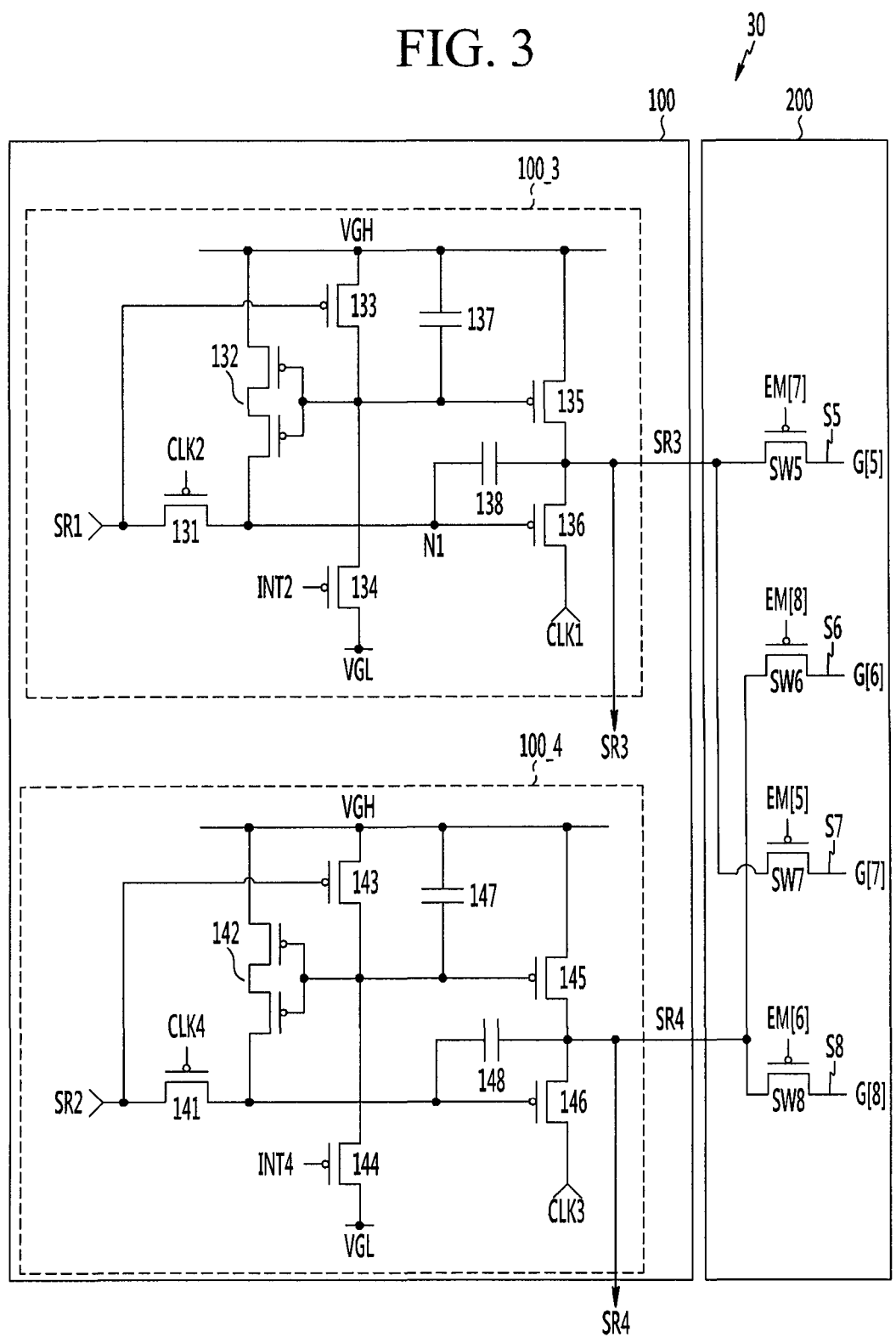

FIGS. 2 and 3 are circuit diagrams of the scan driver according to another example embodiment of the present invention. FIGS. 2 and 3 show a part of the scan driver, which generates a plurality of scan signals G[1]~G[8].

The scan driver 30 includes a shift register unit 100 including a plurality of shift registers and a demultiplexing unit (e.g., demultiplexer) 200 generating scan signals G[1]~G[n] from a plurality of outputs of the shift register unit 100 in response to a plurality of light emitting signals EM[1]~EM[n].

FIG. 2 shows only two shift registers 100_1 and 100_2 included in the shift register unit 100 and some components of the demultiplexing unit 200, which correspond to the two shift registers 100_1 and 100_2, that is, four switches SW1~SW4: Similar to FIG. 2, FIG. 3 shows only two shift registers 100_3 and 100_4 included in the shift register unit 100 and some components of the demultiplexing unit 200, which correspond to the two shift registers 100_3 and 100_4, that is, four switches SW5~SW8.

The four shift registers 100_1~100_4 are each composed of five transistors 111~116, 121~126, 131~136, or 141~146 and two capacitors 117 and 118, 127 and 128, 137 and 138, or 147 and 148. However, this is merely one example embodiment, and in other embodiments the shift registers 100_1~100_4 may have a different structure.

For example, any circuit that can shift an output of a corresponding shift register of the previous stage for a period of time (e.g., a predetermined period of time) may be utilized as the shift register. Hereinafter, the output of the shift register is referred to as a shift output.

Each of the shift registers may receive a shift output of an enable level from a corresponding previous shift register synchronized with a corresponding scan clock. In response to the shift output, the shift register may output another corresponding scan clock signal as a shift output during a period of time (e.g., a predetermined period of time). The previous shift register may be before the present shift register by two stages, and the period of time (e.g., the predetermined period of time) may be one period of a corresponding scan clock.

Hereinafter, the low level is one example of the enable level, and the high level is one example of the disable level.

The shift register 100_1 receives a first scan start signal FLM1, a first initialization signal INT1, a first scan clock signal CLK1, and a second scan clock signal CLK2, and outputs the second scan clock signal CLK2 in response to the first scan start signal FLM1 input in synchronization with the first scan clock signal CLK1 and outputs a high level in response to the first initialization signal INT1. The output of the shift register 100_1 is referred to as shift output SR1.

The shift register 100_2 receives a second scan start signal FLM2, a third initialization signal INT3, a third scan clock signal CLK3, and a fourth scan clock signal CLK4, and outputs the fourth scan clock signal CLK4 in response to the second scan start signal FLM2 input in synchronization with the third scan clock signal CLK3 and outputs a high level in response to the third initialization signal INT3. The output of the shift register 100_2 is referred to as shift output SR2.

The shift register 100_3 receives the shift output SR1, the second initialization signal INT2, the first scan clock signal CLK1, and the second scan clock signal CLK2, and outputs the first scan clock signal CLK1 in response to the shift output SR1 input in synchronization with the second scan clock signal CLK2 and outputs a high level in response to the second initialization signal INT2. The output of the shift register 100_3 is referred to as shift output SR3.

The shift register 100_4 receives the shift output SR2, the fourth initialization signal INT4, the third scan clock signal CLK3, and the fourth scan clock signal CLK4, and outputs the third scan clock signal CLK3 in response to the shift output SR2 input in synchronization with the fourth scan clock signal CLK4 and outputs a high level in response to the fourth initialization signal INT4. The output of the shift register 100_4 is referred to as shift output SR4.

In substantially the same manner, the output of the odd-numbered shift register becomes an input of the next odd-numbered shift register, and the output of the even-numbered shift register becomes an input of the next even-numbered shift register.

In the shift register 100_1, the first scan start signal FLM1 is input to a drain of the transistor 111, the first scan clock signal CLK1 is input to a gate of the transistor 111, and a source of the transistor 111 is coupled to a node N1.

The first scan start signal FLM1 is input to a gate of the transistor 113, a source of the transistor 113 is coupled to a voltage VGH, and a drain of the transistor 113 is coupled to a node N2. The transistor 112 has a double-gate structure. A gate of the transistor 112 is coupled to the node N2, a source of the transistor 112 is coupled to the voltage VGH, and a drain of the transistor 112 is coupled to the node N1.

The first initialization signal INT1 is input to a gate of the transistor 114, a source of the transistor 114 is coupled to the node N2, and a drain of the transistor 114 is coupled to the voltage VGL. A gate of the transistor 115 is coupled to the node N2, a source of the transistor 115 is coupled to the voltage VGH, and a drain of the transistor 115 is coupled to the node N3. In addition, one end (e.g., a source) of the transistor 116 is coupled to the node N3, a gate of the transistor 116 is coupled to the node N1, and the second scan clock signal CLK2 is coupled to the other end (e.g., a drain) of the transistor 116.

The capacitor 117 is coupled between the voltage VGH and the node N2, and the capacitor 118 is coupled between the node N1 and the node N3. The node N3 is an output terminal of the shift register 100_1, and is coupled to ends (e.g., drains) of two corresponding switches SW1 and SW3 in the demultiplexing unit 200.

The descriptions of circuits of the shift registers 100_2, 100_3, and 100_4 are the same as that of the shift register 100_1 and as such the descriptions thereof will be omitted.

The demultiplexing unit 200 includes a plurality of switches (for example, including switches SW1~SW8, which are shown in FIGS. 2 and 3). The gates of the plurality of switches are coupled to corresponding light emission signals. Each of the switches includes one end (e.g., a drain) coupled to the output terminal of a corresponding shift register and the other end (e.g., a source) coupled to a corresponding scan line. Here, at least two switches among the plurality of switches are coupled to the output terminal of the same shift register. For example, SW1 and SW3 are both coupled to the shift register 100_1.

As shown in FIG. 2, one end (e.g., the drain) of the switch SW1 is coupled to the output terminal N3 of the shift register 100_1, and thus the shift output SR1 is input to one end (e.g., the drain) of the switch SW1. The light emission signal EM[3] is input to a gate of the switch SW1, and the other end (e.g., the source) of the switch SW1 is coupled to the scan line S1. The shift output SR2 of the shift register 100_2 is input to one end (e.g., the drain) of the switch SW2, the light emission signal EM[4] is input to a gate of the switch SW2, and the other end (e.g., the source) of the switch SW2 is coupled to the scan line S2. The shift output SR1 of the shift register 100_1 is input to one end (e.g., the drain) of the switch SW3, the light emission signal EM[1] is input to a gate of the switch SW3, and the other end (e.g., the source) of the switch SW3 is coupled to the scan line S3. The shift output SR2 of the shift register 100_2 is input to one end (e.g., the drain) of the switch SW4, the light emission signal EM[2] is input to a gate of the switch SW4, and the other end (e.g., the source) of the switch SW4 is coupled to the scan line S4.

The shift output SR3 of the shift register 100_3 is input to one end (e.g., the drain) of the switch SW5, the light emission signal EM[7] is input to a gate of the switch SW5, and the other end (e.g., the source) of the switch SW5 is coupled to the scan line S5. The output SR4 of the shift register 100_4 is input to one end (e.g., the drain) of the switch SW6, the light emission signal EM[8] is input to a gate of the switch SW6, and the other end (e.g., the source) of the switch SW6 is coupled to the scan line S6. The output SR3 of the shift register 100_3 is input to one end (e.g., the drain) of the switch SW 7, the light emission signal EM[5] is input to a gate of the switch SW7, and the other end (e.g., the source) of the switch SW7 is coupled to the scan line S7. The output SR4 of the shift register 100_4 is input to one end (e.g., the drain) of the switch SW8, the light emission signal EM[6] is input to a gate of the switch SW8, and the other end (e.g., the source) of the switch SW8 is coupled to the scan line S8.

Hereinafter, the light emission driver 40, according to an example embodiment of the present invention, will be described with reference to FIGS. 4 and 5.

Figure 4:
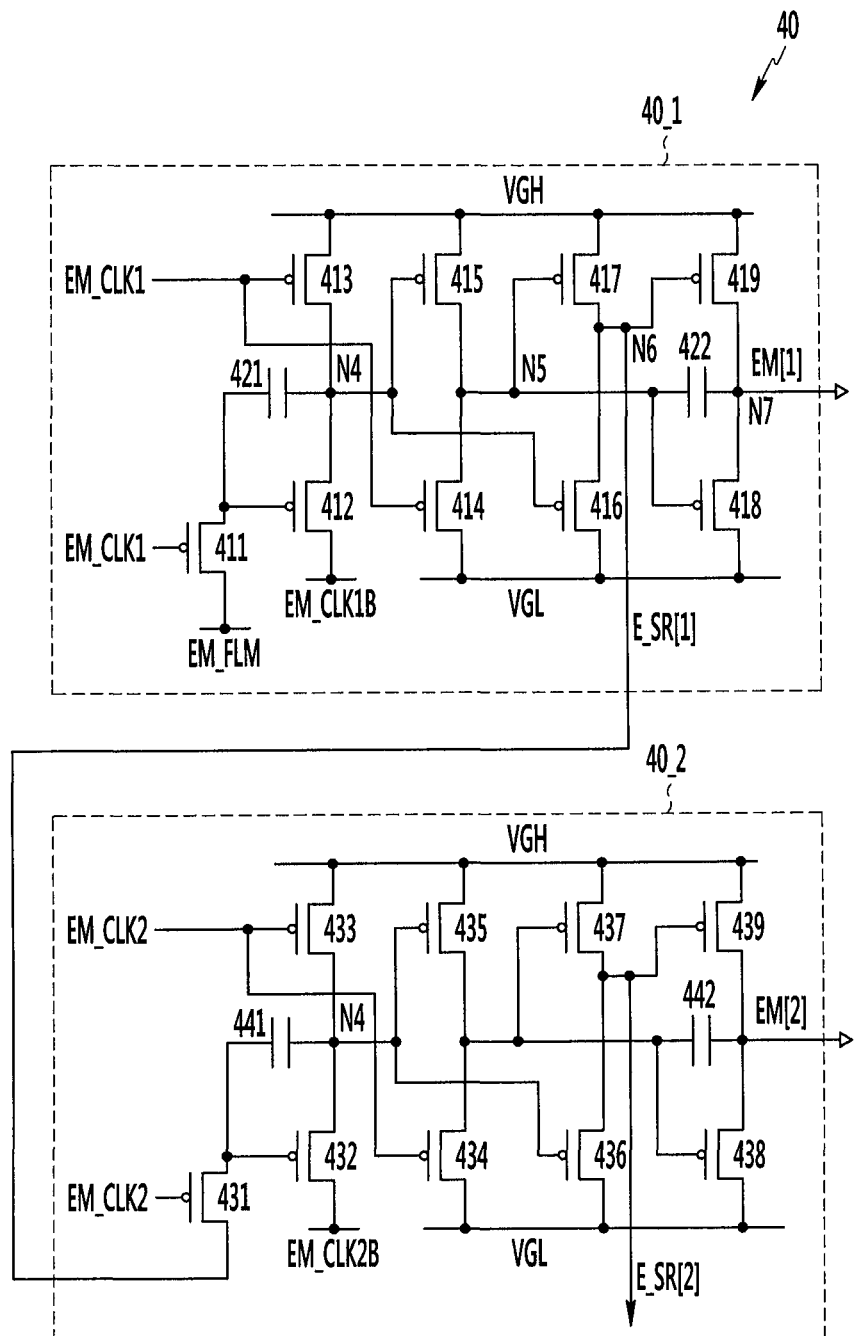
FIGS. 4 and 5 are circuit diagrams of a light emission driver according to another example embodiment of the invention.
Figure 5:
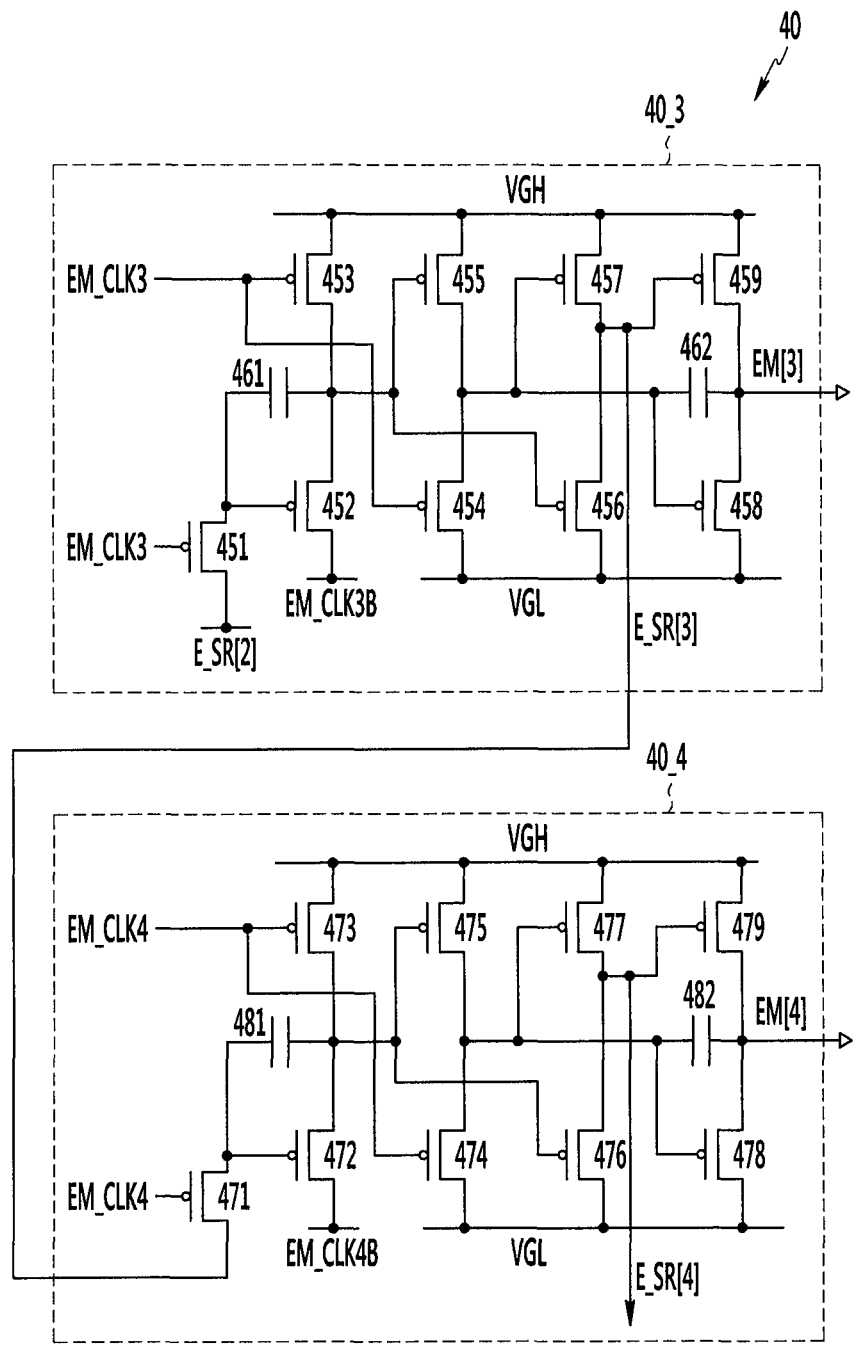

FIGS. 4 and 5 are circuit diagrams of the light emission driver according to another example embodiment of the present invention.

FIG. 4 shows only some components and includes light emission shift registers 40_1 and 40_2 of the light emission driver 40, which generate two light emission signals EM[1] and EM[2], and FIG. 5 shows only some components and includes light emission shift registers 40_3 and 40_4 of the light emission driver 40, which generate two light emission signals EM[3] and EM[4].

The light emission driver 40 is composed of a plurality of light emission shift registers. Each of the light emission shift registers may receive an inverted light emission clock signal corresponding to an input signal of an enable level synchronized with a corresponding light emission clock signal. Each of the light emission shift registers may generate a light emission shift output of an enable level in synchronization with the inverted light emission clock signal and may generate a light emission signal in response to the light emission shift output.

As shown in FIG. 4, a light emission shift register 40_1 receives a first light emission clock signal EM_CLK1, and receives a light emission start signal EM_FLM when the first light emission clock signal EM_CLK1 has a low level. The light emission shift register 40_1 receives a first inverted light emission clock signal EM_CLK1B when the light emission start signal EM_FLM has a low level, which is an enable level. The light emission shift register 40_1 generates a light emission shift output E_SR[1] of a low level when the first inverted light emission clock signal EM_CLK1B has a low level. In addition, the light emission shift register 40_1 outputs a light emission signal EM[1] of a high level in response to the light emission shift output E_SR[1] of a low level.

A light emission shift register 40_2 receives a second light emission clock signal EM_CLK2, and receives the light emission shift output E_SR[1] of the previous light emission shift register 40_1 when the second light emission clock signal EM_CLK2 has a low level. The light emission shift register 40_2 receives a second inverted light emission clock signal EM_CLK2B when the light emission shift output E_SR[1] has a low level, which is an enable level. The light emission shift register 40_2 generates a light emission shift output E_SR[2] of a low level when the second inverted light emission clock signal EM_CLK2B has a low level. In addition, the light emission shift register 40_2 outputs a light emission signal EM[2] of a high level in response to the light emission shift output E_SR[2] of a low level.

As shown in FIG. 5, a light emission shift register 40_3 receives a third light emission clock signal EM_CLK3, and receives a light emission shift output E_SR[2] of the previous light emission shift register 40_2 when the third light emission clock signal EM_CLK3 has a low level. The light emission shift register 40_3 receives a third inverted light emission clock signal EM_CLK3B when the light emission shift output E_SR[2] has a low level, which is an enable level. The light emission shift register 40_3 generates a light emission shift output E_SR[3] of a low level when the third inverted light emission clock signal EM_CLK3B has a low level. In addition, the light emission shift register 40_3 outputs a light emission signal EM[3] of a high level in response to the light emission shift output E_SR[3] of a low level.

A light emission shift register 40_4 receives a fourth light emission clock signal EM_CLK4, and receives the light emission shift output E_SR[3] of the previous light emission shift register 40_3 when the fourth light emission clock signal EM_CLK4 has a low level. The light emission shift register 40_3 receives a fourth inverted light emission clock signal EM_CLK4B when the light emission shift output E_SR[3] has a low level, which is an enable level. The light emission shift register 40_4 generates a light emission shift output E_SR[4] of a low level when the fourth inverted light emission clock signal EM_CLK4B has a low level. In addition, the light emission shift register 40_4 outputs a light emission signal EM[4] of a high level in response to the light emission shift output E_SR[4] of a low level.

In this manner, between the neighboring light emission shift registers, the light emission shift output of the light emission shift register (e.g., 40_1) becomes an input of the next light emission shift register (e.g., 40_2).

Specifically, the four light emission shift registers 40_1~40_4 shown in FIGS. 4 and 5 each include nine transistors 411~419, 431~439, 451~459, and 471~479, respectively, and each include two capacitors 421~422, 441~442, 461~462, and 481~482, respectively.

Regarding the light emission shift register 40_1, the first light emission clock signal EM_CLK1 is input to a gate of the transistor 411, one end (e.g., a drain) of the transistor 411 is coupled to one electrode of the capacitor 421 and a gate of the transistor 412, and the light emission start signal EM_FLM is coupled to the other end (e.g., a source) of the transistor 411. The other electrode of the capacitor 421 is coupled to the node N4.

In addition, one end (e.g., a drain) of the transistor 412 receives the first inverted light emission clock signal EM_CLK1B, and the other end (e.g., a source) of the transistor 412 is coupled to a node N4. The transistor 413 is coupled between a voltage VGH and the node N4, and a gate of the transistor 413 receives the first light emission clock signal EM_CLK1.

The transistor 414 is coupled between a node N5 and a voltage VGL, and a gate of the transistor 414 receives the first light emission clock signal EM_CLK1. The transistor 415 is coupled between the voltage VGH and the node N5, and a gate of the transistor 415 is coupled to the node N4.

The transistor 416 is coupled between a node N6 and the voltage VGL, and a gate of the transistor 416 is coupled to the node N4. Transistor 417 is coupled between the voltage VGH and the node N6, and a gate of the transistor 417 is coupled to the node N5.

The transistor 418 is coupled between a node N7 and the voltage VGL, and a gate of the transistor 418 is coupled to the node N5. The transistor 419 is coupled between the voltage VGH and the node N7, and a gate of the transistor 419 is coupled to the node N6. The capacitor 422 is coupled between the gate and the source of the transistor 418.

The voltage of the node N6 becomes a light emission shift output E_SR[1], and the light emission shift output E_SR[1] becomes an input signal of the next light emission shift register 40_2. The voltage of the node N7 is a light emission signal EM[1].

The light shift register 40_2 is coupled to the light emission shift output E_SR[1] of the light emission shift register 40_1, and receives a second light emission clock signal EM_CLK2 and a second inverted light emission clock signal EM_CLK2B. The light shift register 40_3 is coupled to the light emission shift output E_SR[2], and receives a third light emission clock signal EM_CLK3 and a third inverted light emission clock signal EM_CLK3B. The light shift register 40_4 is coupled to the light emission shift output E_SR[3], and receives a fourth light emission clock signal EM_CLK4 and a fourth inverted light emission clock signal EM_CLK4B.

Since respective components of the light emission shift registers 40_2~40_4 and connections therebetween can be fully understood from the disclosure of the light emission shift register 40_1, detailed descriptions thereof will be omitted.

Although not shown in FIGS. 4 and 5, light emission shift registers following the light emission shift register 40_4 respectively receive the first light emission clock signal EM_CLK1 and the first inverted light emission clock signal EM_CLK1B, the second light emission clock signal EM_CLK2 and the second inverted light emission clock signal EM_CLK2B, the third light emission clock signal EM_CLK3 and the third inverted light emission clock signal EM_CLK3B, and the fourth light emission clock signal EM_CLK4 and the fourth inverted light emission clock signal EM_CLK4B, in that order.

Hereinafter, operations of the scan driver and the light emission driver according to another example embodiment of the invention will be described with reference to FIGS. 6-8.

Figure 6:
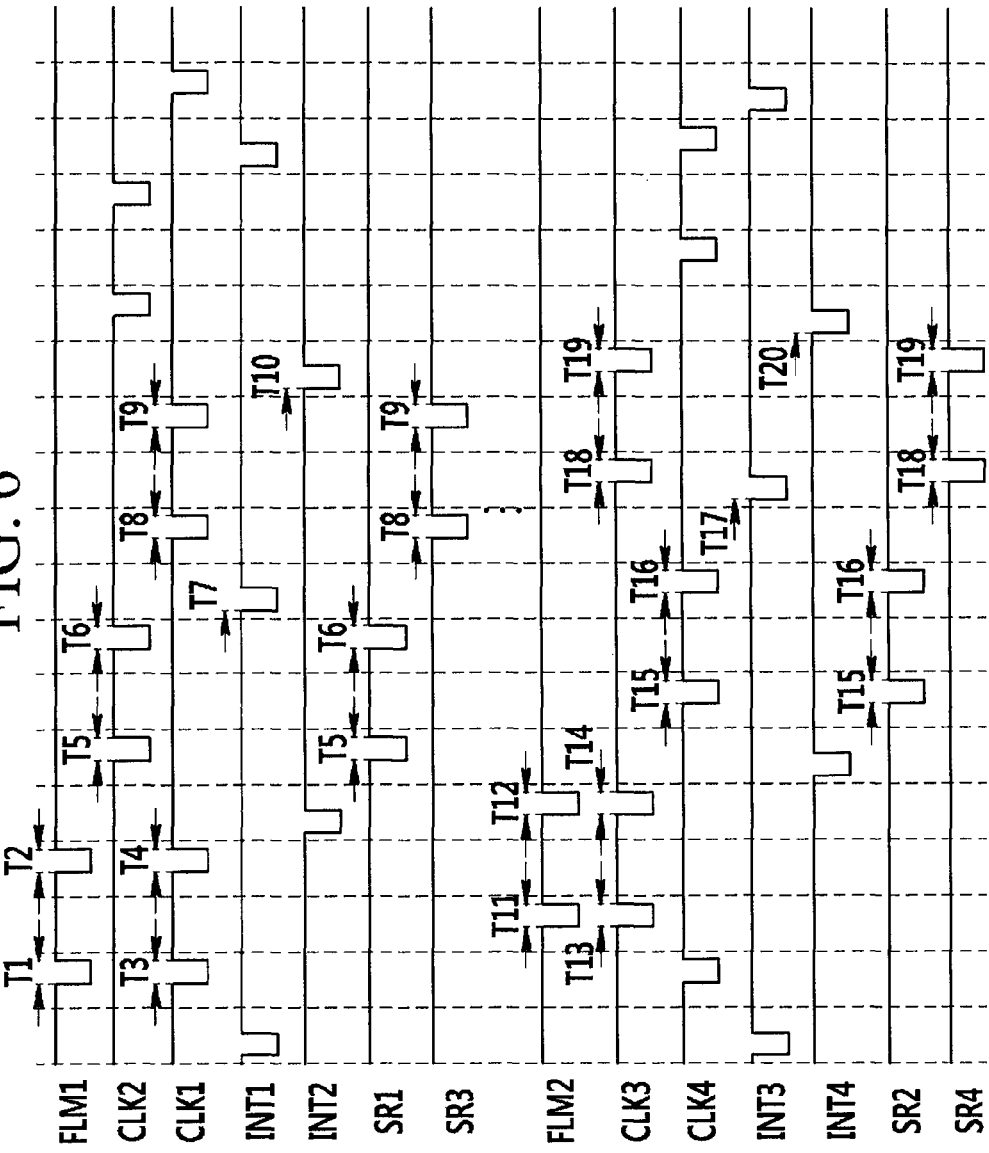
FIG. 6 shows waveform diagrams of signals and a plurality of shift outputs, which are input to the scan driver according to another example embodiment of the invention.

FIG. 6 shows waveform diagrams of signals and a plurality of shift outputs, which are input to the scan driver according to another example embodiment of the invention.

Figure 7:
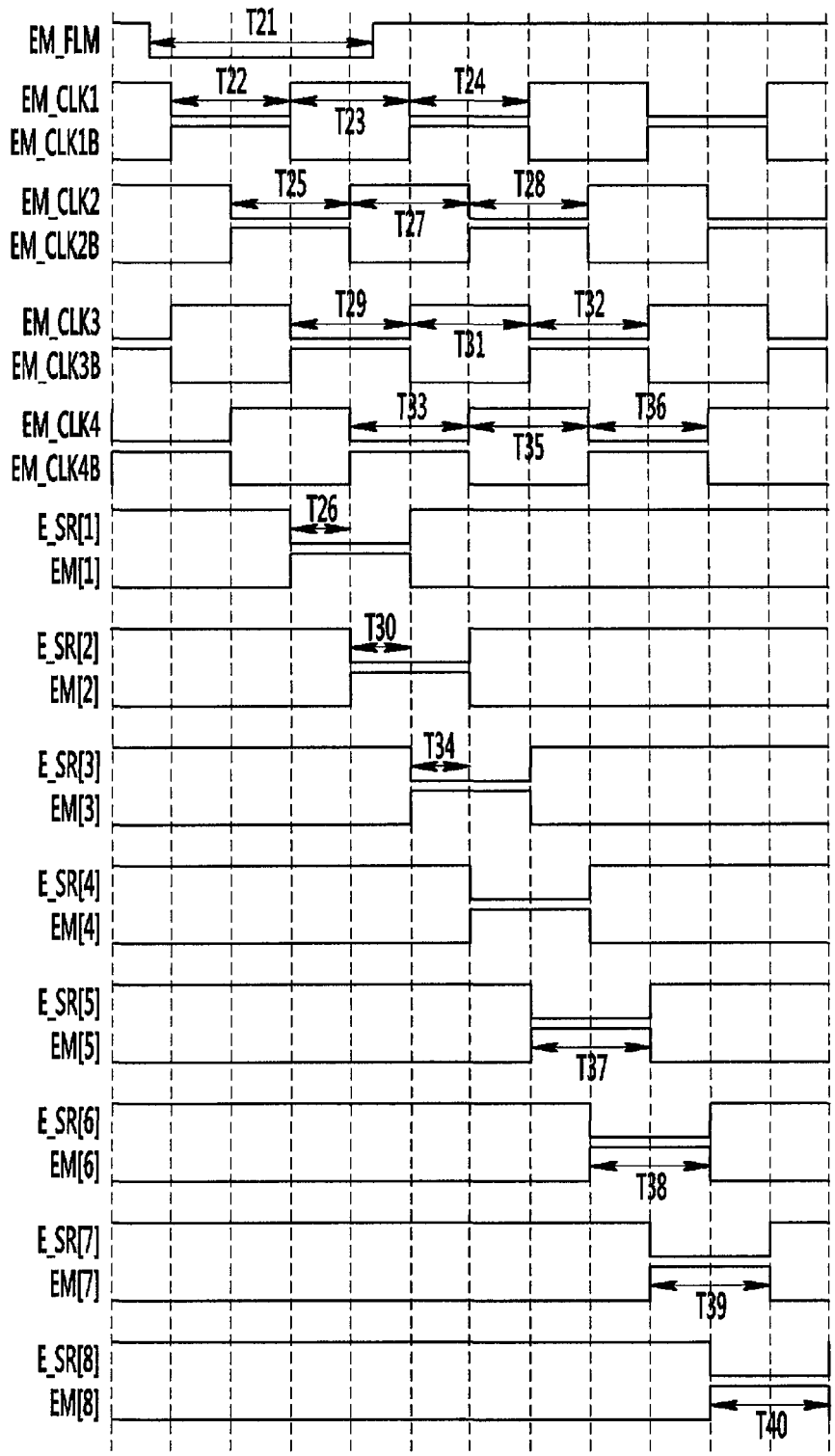
FIG. 7 shows waveform diagrams of signals, a plurality of light emission shift outputs, and a plurality of light emitting signals, which are input to the light emission driver according to another example embodiment of the invention.

FIG. 7 shows waveform diagrams of signals, a plurality of light emission shift outputs, and a plurality of light emission signals, which are input to the light emission driver according to another example embodiment of the invention.

Figure 8:
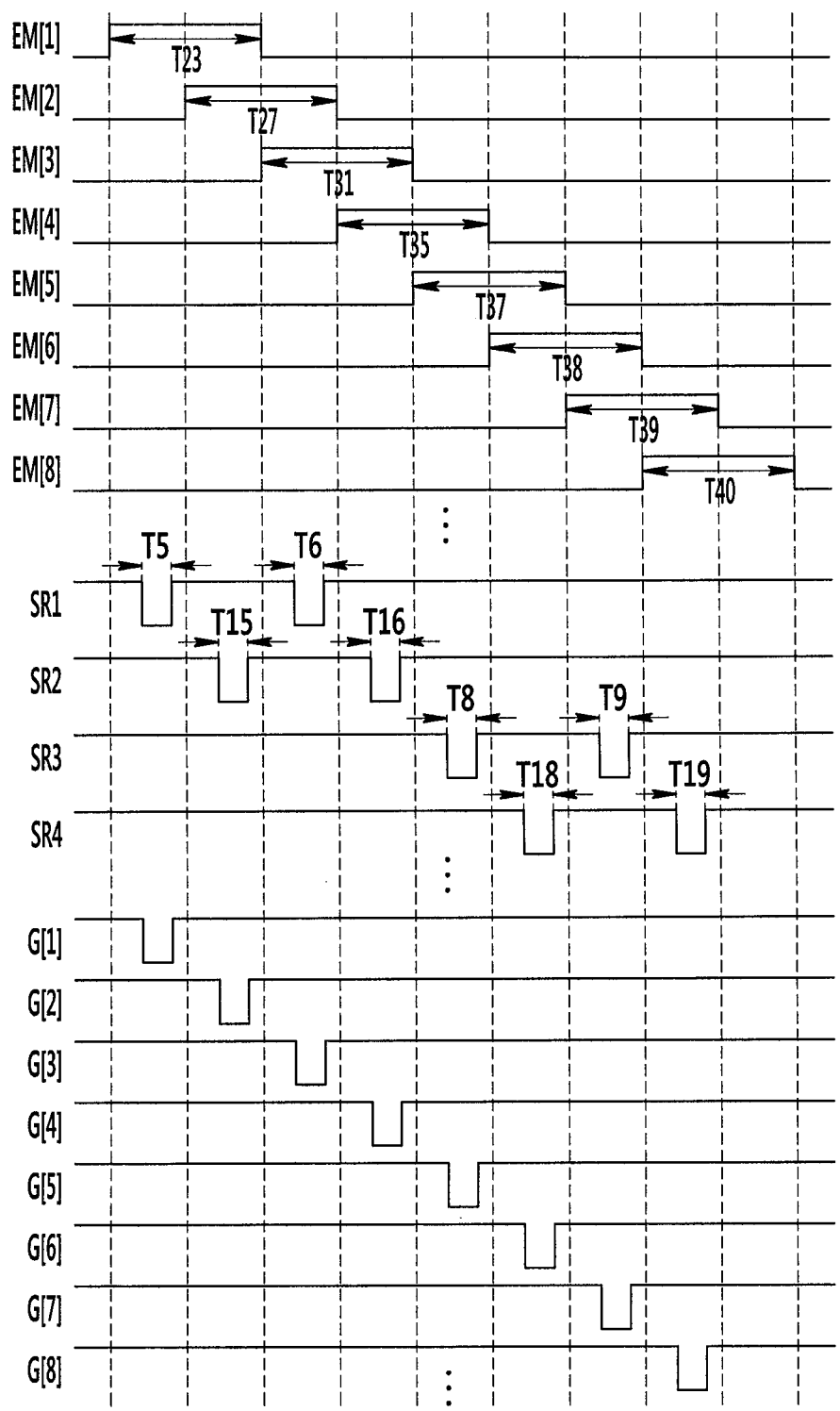
FIG. 8 shows waveform diagrams of a plurality of light emitting signals, a plurality of shift outputs, and a plurality of scan signals according to another example embodiment of the invention.

FIG. 8 shows waveform diagrams of a plurality of light emission signals, a plurality of shift outputs, and a plurality of scan signals according to another example embodiment of the invention.

As shown in FIG. 6, a first scan start signal FLM1 having a low-level pulse during periods T1 and T2 is generated. A first scan clock signal CLK1 and a second scan clock signal CLK2 each have two low-level pulses at a period of time (e.g., a predetermined period of time). The first scan clock signal CLK1 and the second scan clock signal CLK2 have a half-period phase difference therebetween. For example, the first scan clock signal CLK1 has low-level pulses during periods T3 and T4, and the second scan clock signal CLK2 has low-level pulses during periods T5 and T6.

An overlap period is present between periods T1 and T3, and an overlap period is present between periods T2 and T4. FIG. 6 shows that the first scan start signal FLM1 has two low-level pulses, but is not limited thereto. The first scan start signal FLM1 may have a low level during at least a period of time (e.g., a predetermined period of time), and the at least a period of time (e.g., a predetermined period of time) may overlap a period of the low-level pulse of the first scan clock signal CLK1.

An operation of the shift register 100_1 will now be described.

During period T1, the transistor 113 is turned on. The voltage VGH, which is a high-level voltage, is transmitted to the node N2 and thus the transistor 115 is turned off. The capacitor 117 maintains the off-state of the transistor 115. During period T2, the transistor 113 is turned on, and the same operation as described above is performed.

During period T3, the transistor 111 is turned on. During the overlap period of periods T1 and T3, the low-level pulse of the first scan start signal FLM1 is transmitted to the node N1, and thus the transistor 116 is turned on. Since the capacitor 118 maintains the gate-source voltage difference of the transistor 116, the on state of the transistor 116 is maintained. While the transistor 116 is turned on, the shift output SR1 is the second scan clock signal CLK2.

During period T4, the transistor 111 is turned on. During the overlap period of periods T2 and T4, the low-level pulse of the first scan start signal FLM1 is transmitted to the node N1, and thus the on-state of the transistor 116 is maintained. Therefore, the shift output SR1 is the second scan clock signal CLK2 until the time point when the transistor 116 is turned off. That is, as shown in FIG. 4, a shift output SR1 having a low-level pulse during periods T5 and T6 is generated.

At time point T7, when the first initialization signal INT1 falls to a low level, the transistor 114 is turned on and the voltage VGL, which is a low-level voltage, is transmitted to the node N2, and the transistor 112 and the transistor 115 are turned on. As the transistor 112 is turned on, the node N1 is coupled to the voltage VGH and thus the transistor 116 is turned off. As the transistor 115 is turned on, the node N3 is coupled to the voltage VGH. Therefore, the shift output SR1 after the time point T7 has a high level.

An operation of the shift register 100_3 will now be described.

During period T5, the transistor 133 is turned on. The transistor 135 is turned off by the voltage VGH, and the capacitor 137 maintains the off-state of the transistor 135. During period T6, the transistor 133 is turned on, and the same operation as described above is performed.

During period T5, the transistor 131 is turned on, and during period T5, the transistor 136 is turned on. The capacitor 138 maintains the on-state of the transistor 136. During the period when the transistor 136 is turned on, the shift output SR3 is the first scan clock signal CLK1.

Also, during period T6, the transistor 131 is turned on, and during period T6, the on-state of the transistor 136 is maintained. Therefore, the shift output SR3 is the first scan clock signal CLK1 until the time point when the transistor 136 is turned off and as shown in FIG. 6, a shift output SR3 having a low-level pulse during periods T8 and T9 is generated.

At time point T10, when the second initialization signal INT2 falls to a low level, the transistor 134 is turned on, and the transistor 132 and the transistor 135 are turned on by the voltage VGL and the voltage VGH is coupled to the gate of the transistor 136, and thus the transistor 136 is turned off. As the transistor 135 is turned on, the shift output SR3 after the time point T10 has a high level.

As shown in FIG. 6, a first second start signal FLM2 having a low-level pulse during periods T11 and T12 is generated. A third scan clock signal CLK3 and a fourth scan clock signal CLK4 each have two low-level pulses at a period of time (e.g., a predetermined period of time). The third scan clock signal CLK3 and the fourth scan clock signal CLK4 have a half-period phase difference therebetween. For example, the third scan clock signal CLK3 has low-level pulses during periods T13 and T14, and the fourth scan clock signal CLK4 has low-level pulses during periods T15 and T16.

In addition, the third scan clock signal CLK3 and the first scan clock signal CLK1 have a ⅛-period phase difference therebetween, and the fourth scan clock signal CLK4 and the second scan clock signal CLK2 have a ⅛-period phase difference therebetween.

An overlap period is present between periods T11 and T13, and an overlap period is present between periods T12 and T14. FIG. 6 shows that the second scan start signal FLM2 has two low-level pulses, but is not limited thereto. The second scan start signal FLM2 may have a low level during at least a period of time (e.g., a predetermined period of time), and the at least a period of time (e.g., a predetermined period of time) may overlap a period of the low-level pulse of the third scan clock signal CLK3.

An operation of the shift register 100_2 will now be described.

During period T11, the transistor 123 is turned on. The voltage VGH is transmitted to the gate of the transistor 125 and thus the transistor 125 is turned off. The capacitor 127 maintains the off-state of the transistor 125. During period T2, the transistor 123 is turned on, and the same operation as described above is performed.

During period T13, the transistor 121 is turned on. During the overlap period of periods T11 and T13, the low-level pulse of the second scan start signal FLM2 is transmitted to the gate of the transistor 126 and thus the transistor 126 is turned on. The capacitor 128 maintains the on-state of the transistor 126. While the transistor 126 is turned on, the shift output SR2 is the fourth scan clock signal CLK4.

During period T14, the transistor 121 is turned on. During the overlap period of periods T12 and T14, the low-level pulse of the second scan start signal FLM2 is transmitted to the gate of the transistor 126, and thus the on-state of the transistor 126 is maintained. Therefore, the shift output SR2 is the fourth scan clock signal CLK4 until the time point when the transistor 126 is turned off. That is, as shown in FIG. 4, the shift output SR2 having a low-level pulse during periods T15 and T16 is generated.

At time point T17, when the third initialization signal INT3 falls to a low level, the transistor 124 is turned on and the voltage VGL, which is a low-level voltage, is transmitted to the gates of the transistor 122 and the transistor 125, and thus the two transistors 122 and 125 are turned on. As the transistor 122 is turned on, the gate of the transistor 126 is coupled to the voltage VGH and thus the transistor 126 is turned off. As the transistor 125 is turned on, the shift output SR[2] is the voltage VGH. Therefore, the shift output SR2 after the time point T17 has a high level.

An operation of the shift register 100_4 will now be described.

During period T15, the transistor 143 is turned on. The transistor 145 is turned off by the voltage VGH, and the capacitor 147 maintains the off-state of the transistor 145. Also, during period T16, the transistor 143 is turned on, and the same operation as described above is performed.

During period T15, the transistor 141 is turned on, and during period T15, the transistor 146 is turned on. The capacitor 148 maintains the on-state of the transistor 146. During the period when the transistor 146 is turned on, the shift output SR4 is the third scan clock signal CLK3.

Also during period T16, the transistor 141 is turned on, and the on-state of the transistor 146 is maintained. Therefore, the shift output SR4 is the third scan clock signal CLK3 until the time point when the transistor 146 is turned off and, as shown in FIG. 6, the shift output SR4 having a low-level pulse during periods T18 and T19 is generated.

At time point T20, when the fourth initialization signal INT4 falls to a low level, the transistor 144 is turned on, and the transistor 142 and the transistor 145 are turned on by the voltage VGL and the voltage VGH is coupled to the gate of the transistor 146, and thus the transistor 146 is turned off. As the transistor 145 is turned on, the shift output SR4 after the time point T20 has a high level.

The plurality of shift outputs may be sequentially generated inside the scan driver 30 in this manner.

Hereinafter, an operation of the light emission driver will be described with reference to FIG. 7.

The first to fourth light emission clock signals EM_CLK1~EM_CLK4 are generated while being delayed by the ¼ period. That is, there is a ¼-period phase difference between the first and second light emission clock signals EM_CLK1 and EM_CLK2, between the second and third light emission clock signals EM_CLK2 and EM_CLK3, and between the third and fourth light emission clock signals EM_CLK3 and EM_CLK4.

As shown in FIG. 7, the light emission start signal EM_FLM has an enable level during period T21. During period T22 in period T21, the first light emission clock signal EM_CLK1 has a low level and thus the transistor 411 is turned on. Also, during period T22 the first inverted light emission clock signal EM_CLK1B has a high level.

During period T22, the light emission start signal EM_FLM of a low level is input to the gate of the transistor 412 and thus the transistor 412 is turned on. The capacitor 421 maintains the gate-source voltage difference of the transistor 412, thereby maintaining the on-state of the transistor 412.

As the transistor 412 is turned on, the node N4 is coupled to the first inverted light emission clock signal EM_CLK1B. During period T22, the transistor 415 and the transistor 416 are turned off since the first inverted light emission clock signal EM_CLK1B supplied to the node N4 has a high level. During period T22, the transistors 413 and 414 are turned on by the first light emission clock signal EM_CLK1, and thus the node N5 is coupled to the voltage VGL and the transistor 417 and the transistor 418 are turned on.

As the transistor 417 is turned on, the node N6 is coupled to the voltage VGH and thus the transistor 419 is turned off. The capacitor 422 maintains the gate-source voltage difference of the transistor 418, thereby maintaining the on-state of the transistor 418. During period T22, the voltage VGL is output as the light emission signal EM[1]. FIG. 7 shows that the light emission signal EM[1] has a low level also prior to period T22, but the light emission signal EM[1] may fall to a low level at the start time point of period T22. The light emission shift output E_SR[1] is a voltage of the node N6, and thus has a high level during period T22.

During period T23, the first light emission clock signal EM_CLK1 has a high level and the first inverted light emission clock signal EM_CLK1B has a low level. Also during period T23 following period T22, the transistor 412 is in an on-state. Therefore, the node N4 is in a low level by the first inverted light emission clock signal EM_CLK1B, and thus the transistors 415 and 416 having gates coupled to the node N4 are turned on. The transistors 411, 413, and 414 are turned off by the first light emission clock signal EM_CLK1.

As the transistor 415 is turned on, the node N5 is coupled to the high-level voltage VGH, and thus the transistors 417 and 418 are turned off. As the transistor 416 is turned on, the node N6 is coupled to the low-level voltage VGL and thus the light emission shift output E_SR[1] has a low level, and the transistor 419 is turned on and thus the light emission signal EM[1] has a high level.

During period T24, the first light emission clock signal EM_CLK1 again has a low level and the first inverted light emission clock signal EM_CLK1B again has a high level. The light emission start signal EM_FLM of a high level is input to the gate of the transistor 412 and thus the transistor 412 is turned off, and the capacitor 421 maintains the off-state of the transistor 412. As the transistor 413 is turned on by the first light emission clock signal EM_CLK1, the node N4 is coupled to the high-level voltage VGH.

The transistors 415 and 416 having gates coupled to the node N4 are turned off, and the transistor 414 is turned on by the first light emission clock signal EM_CLK1. As the transistor 414 is turned on, the node N5 is coupled to the low-level voltage VGL, and thus the transistors 417 and 418 are turned on.

As the transistor 417 is turned on, the node N6 is coupled to the voltage VGH and thus the transistor 419 is turned off. The capacitor 422 maintains the gate-source voltage difference of the transistor 418, thereby maintaining the on-state of the transistor 418, and the light emission signal EM[1] becomes a low-level voltage VGL. The light emission shift output E_SR[1] is a voltage of the node N6, and thus has a high level during period T24. The light emission shift output E_SR[1] and the output of the light emission signal EM[1] are maintained from period T24 to a period when the low level of the light emission start signal EM_FLM and the low level of the first light emission clock signal EM_CLK1 overlap each other.

During period T25, the second light emission clock signal EM_CLK2 has a low level and the second inverted light emission clock signal EM_CLK1B has a high level. During period T25, the transistors 431, 433, and 434 are turned on by the second light emission clock signal EM_CLK2.

As the transistor 433 is turned on, the gate of the transistor 435 is coupled to the high-level voltage VGH and thus the transistor 435 is turned off. As the transistor 434 is turned on, the gates of the transistors 437 and 438 are coupled to the low-level voltage VGL and thus the transistors 437 and 438 are turned on. As the transistor 437 is turned on, the gate of the transistor 439 is coupled to the high-level voltage VGH, and thus the transistor 439 is turned off. The light emission shift output E_SR[2] has a high level, and the light emission signal EM[2] has a low level.

During period T26 in period T25, the light emission shift output E_SR[1] has a low level. The low level is transmitted to the gate of the transistor 432 through the transistor 431 in an on-state, and thus the transistor 432 is turned on. The capacitor 441 maintains the gate-source voltage difference of the transistor 432, thereby maintaining the on-state of the transistor 432.

During period T26, the second inverted light emission clock signal EM_CLK2B has a high level, and thus the gates of the transistors 435 and 436 are coupled to the high-level voltage through the turned-on transistor 432. Therefore, the two transistors 435 and 436 are in an off-state.

During period T27, the second light emission clock signal EM_CLK2 has a high level and the second inverted light emission clock signal EM_CLK2B has a low level. The transistors 433 and 434 are turned off by the second light emission clock signal EM_CLK2. As the on-state of the transistor 432 is maintained, the transistors 435 and 436 are turned on by the low level of second inverted light emission clock signal EM_CLK2B.

The gates of the transistors 437 and 438 are coupled to the high-level voltage VGH through the turned-on transistor 435, and thus the transistors 437 and 438 are turned off. The gate-source voltage difference of the transistor 438 is maintained by the capacitor 442. The gate of the transistor 439 is coupled to the low-level voltage VGL through the turned-on transistor 436, and thus the transistor 439 is turned on. During period T27, the light emission shift output E_SR[2] has a low level and the light emission signal EM[2] has a high level.

During period T28, the second light emission clock signal EM_CLK2 again has a low level and the second inverted light emission clock signal EM_CLK2B again has a high level.

The light emission shift output E_SR[1] of a high level is input to the gate of the transistor 432 and thus the transistor 432 is turned off. The capacitor 441 maintains the off-state of the transistor 432. The transistor 433 is turned on by the second light emission clock signal EM_CLK2 and the gates of the transistors 435 and 436 are coupled to the high-level voltage VGH, and thus the transistors 435 and 436 are turned off. The transistor 434 is turned on by the second light emission clock signal EM_CLK2 and the gates of the transistors 437 and 438 are coupled to the low-level voltage VGL, and thus the transistors 437 and 438 are turned on.

As the transistor 437 is turned on, the high-level voltage VGH is coupled to the gate of the transistor 439. The transistor 439 is turned off, and the light emission shift output E_SR[2] has a high level. The capacitor 442 maintains the gate-source voltage difference of the transistor 438, thereby maintaining the on-state of the transistor 438, and the light emission signal EM[2] becomes a low-voltage voltage VGL. The light emission shift output E_SR[2] and the output of the light emission signal EM[2] are maintained from period T28 to a period when the low level of the light emission shift output E_SR[1] and the low level of the second light emission clock signal EM_CLK2 overlap each other.

During period T29, the third light emission clock signal EM_CLK3 has a low level and the third inverted light emission clock signal EM_CLK3B has a high level. During period T29, the transistors 451, 453, and 454 are turned on by the third light emission clock signal EM_CLK3.

As the transistor 453 is turned on, the gates of the transistors 455 and 456 are coupled to the high-level voltage VGH and thus the transistors 455 and 456 are turned off. As the transistor 454 is turned on, the gates of the transistors 457 and 458 are coupled to the low-level voltage VGL and thus the transistors 457 and 458 are turned on. As the transistor 457 is turned on, the gate of the transistor 459 is coupled to the high-level voltage VGH, and thus the transistor 459 is turned off. The light emission shift output E_SR[3] has a high level, and the light emission signal EM[3] has a low level.

During period T30 in period T29, the light emission shift output E_SR[2] has a low level. The low level is transmitted to the gate of the transistor 452 through the transistor 451 in an on-state, and thus the transistor 452 is turned on. The capacitor 461 maintains the gate-source voltage difference of the transistor 452, thereby maintaining the on-state of the transistor 452.

During period T30, the third inverted light emission clock signal EM_CLK3B has a high level, and thus the gates of the transistors 455 and 456 are coupled to the high-level voltage through the turned-on transistor 452. Therefore, the two transistors 455 and 456 are in an off-state.

During period T31, the third light emission clock signal EM_CLK3 has a high level and the third inverted light emission clock signal EM_CLK3B has a low level. The transistors 453 and 454 are turned off by the third light emission clock signal EM_CLK3. As the on-state of the transistor 452 is maintained, the transistors 455 and 456 are turned on by the third inverted light emission clock signal EM_CLK3B of a low level.

The gates of the transistors 457 and 458 are coupled to the high-level voltage VGH through the turned-on transistor 455, and thus the transistors 457 and 458 are turned off. The gate-source voltage difference of the transistor 458 is maintained by the capacitor 462. The gate of the transistor 459 is coupled to the low-level voltage VGL through the turned-on transistor 456, and thus the transistor 459 is turned on. During period T31, the light emission shift output E_SR[3] has a low level and the light emission signal EM[3] has a high level.

During period T32, the third light emission clock signal EM_CLK3 again has a low level and the third inverted light emission clock signal EM_CLK3B again has a high level.

The light emission shift output E_SR[2] of a high level is input to the gate of the transistor 452 and thus the transistor 452 is turned off. The capacitor 461 maintains the off-state of the transistor 452. The transistor 453 is turned on by the third light emission clock signal EM_CLK3 and the gates of the transistors 455 and 456 are coupled to the high-level voltage VGH, and thus the transistors 455 and 456 are turned off. The transistor 454 is turned on by the third light emission clock signal EM_CLK3 and the gates of the transistors 457 and 458 are coupled to the low-level voltage VGL, and thus the transistors 457 and 458 are turned on.

As the transistor 457 is turned on, the high-level voltage VGH is coupled to the gate of the transistor 459. The transistor 459 is turned off, and the light emission shift output E_SR[3] has a high level. The capacitor 462 maintains the gate-source voltage difference of the transistor 458, thereby maintaining the on-state of the transistor 458, and the light emission signal EM[3] becomes the low-level voltage VGL. The light emission shift output E_SR[3] and the output of the light emission signal EM[3] are maintained from period T32 to a period when the low level of the light emission shift output E_SR[2] and the low level of the third light emission clock signal EM_CLK3 overlap each other.

During period T33, the fourth light emission clock signal EM_CLK4 has a low level and the fourth inverted light emission clock signal EM_CLK4B has a high level. During period T33, the transistors 471, 473, and 474 are turned on by the fourth light emission clock signal EM_CLK4.

As the transistor 473 is turned on, the gates of the transistors 475 and 476 are coupled to the high-level voltage VGH and thus the transistors 475 and 476 are turned off. As the transistor 474 is turned on, the gates of the transistors 477 and 478 are coupled to the low-level voltage VGL and thus the transistors 477 and 478 are turned on. As the transistor 477 is turned on, the gate of the transistor 479 is coupled to the high-level voltage VGH, and thus the transistor 479 is turned off. As the transistor 478 is turned on, the light emission shift output E_SR[4] has a high level, and the light emission signal EM[4] has a low level.

During period T34 in period T33, the light emission shift output E_SR[3] has a low level. The low level is transmitted to the gate of the transistor 472 through the transistor 471 in an on-state, and thus the transistor 472 is turned on. The capacitor 481 maintains the gate-source voltage difference of the transistor 472, thereby maintaining the on-state of the transistor 472.

During period T34, the fourth inverted light emission clock signal EM_CLK4B has a high level, and thus the gates of the transistors 475 and 476 are coupled to the high-level voltage through the turned-on transistor 472. Therefore, the transistors 475 and 476 are in an off-state.

During period T35, the fourth light emission clock signal EM_CLK4 has a high level and the fourth inverted light emission clock signal EM_CLK4B has a low level. The transistors 471, 473, and 474 are turned off by the fourth light emission clock signal EM_CLK4. As the on-state of the transistor 472 is maintained, the transistors 475 and 476 are turned on by the fourth inverted light emission clock signal EM_CLK4B.

The gates of the transistors 477 and 478 are coupled to the high-level voltage VGH through the turned-on transistor 475, and thus the transistors 477 and 478 are turned off. The gate-source voltage difference of the transistor 478 is maintained by the capacitor 482. The gate of the transistor 479 is coupled to the low-level voltage VGL through the turned-on transistor 476, and thus the transistor 479 is turned on. During period T35, the light emission shift output E_SR[4] has a low level and the light emission signal EM[4] has a high level.

During period T36, the fourth light emission clock signal EM_CLK4 again has a low level and the fourth inverted emission clock signal EM_CLK4B again has a high level.

The light emission shift output E_SR[3] of a high level is input to the gate of the transistor 472 and thus the transistor 472 is turned off. The capacitor 481 maintains the off-state of the transistor 472. The transistor 473 is turned on by the fourth light emission clock signal EM_CLK4 and the gates of the transistors 475 and 476 are coupled to the high-level voltage VGH, and thus the transistors 475 and 476 are turned off. The transistor 474 is turned on by the fourth light emission clock signal EM_CLK4 and the gates of the transistors 477 and 478 are coupled to the low-level voltage VGL, and thus the transistors 477 and 478 are turned on.

As the transistor 477 is turned on, the high-level voltage VGH is coupled to the gate of the transistor 479 and thus the transistor 479 is turned off, and the light emission shift output E_SR[4] has a high level. The capacitor 482 maintains the gate-source voltage difference of the transistor 478, thereby maintaining the on-state of the transistor 478, and the light emission signal EM[4] becomes the low-level voltage VGL. The light emission shift output E_SR[4] and the output of the light emission signal EM[4] are maintained from period T36 to a period when the low level of the light emission shift output E_SR[3] and the low level of the fourth light emission clock signal EM_CLK4 overlap each other.

This operation is repeated by the following light emission shift registers, so that, as shown in FIG. 7, light emission shift outputs E_SR[5]~E_SR[8] having a high level during a period of time (e.g., a predetermined period of time) (for example, T37, T38, T39, T40, and the like) and light emission signals EM[5]~EM[8] having a low level during a period of time (e.g., a predetermined period of time) (for example, T37, T38, T39, T40, and the like) are sequentially generated.

Hereinafter, an operation of the demultiplexing unit 200 will be described with reference to FIG. 8.

In FIG. 8, periods when a plurality of scan signals G[1]~G[8] have a low-level pulse are periods when corresponding scan lines are selected. That is, the enable level of the scan signal is a low level.

During period T5 when a low-level pulse is generated in the shift output SR1, the switch SW1 is in an on-state by the third light emission signal EM[3] and the switch SW3 is in an off-state by the first light emission signal EM[1]. Therefore, the scan signal G[1] has a low-level pulse during period T5.

During period T6 when a low-level pulse is generated in the shift output SR1, the switch SW1 is in an off-state by the third light emission signal EM[3] and the switch SW3 is in an on-state by the first light emission signal EM[1]. Therefore, the scan signal G[3] has a low-level pulse during period T6.

During period T15 when a low-level pulse is generated in the shift output SR2, the switch SW2 is in an on-state by the fourth light emission signal EM[4] and the switch SW4 is in an off-state by the second light emission signal EM[2]. Therefore, the scan signal G[2] has a low-level pulse during period T15. During period T16 when a low-level pulse is generated in the shift output SR2, the switch SW2 is in an off-state by the fourth light emission signal EM[4] and the switch SW4 is in an on-state by the second light emission signal EM[2]. Therefore, the scan signal G[4] has a low-level pulse during period T16.

During period T18 when a low-level pulse is generated in the shift output SR3, the switch SW5 is in an on-state by the seventh light emission signal EM[7] and the switch SW7 is in an off-state by the fifth light emission signal EM[5]. Therefore, the scan signal G[5] has a low-level pulse during period T8. During period T9 when a low-level pulse is generated in the shift output SR3, the switch SW5 is in an off-state by the seventh light emission signal EM[7] and the switch SW7 is in an on-state by the fifth light emission signal EM[5]. Therefore, the scan signal G[7] has a low-level pulse during period T9.

During period T18 when a low-level pulse is generated in the shift output SR4, the switch SW6 is in an on-state by the eighth light emission signal EM[8] and the switch SW8 is in an off-state by the sixth light emission signal EM[6]. Therefore, the scan signal G[6] has a low-level pulse during period T18. During period T19 when a low-level pulse is generated in the shift output SR4, the switch SW6 is in an off-state by the eighth light emission signal EM[8] and the switch SW8 is in an on-state by the sixth light emission signal EM[6]. Therefore, the scan signal G[8] has a low-level pulse during period T19.

These operation waveforms are repeated, and controlled by the plurality of light emission signals, thereby outputting two scan signals of an enable level, respectively, which correspond to each of the plurality of shift outputs.

Since one shift output is used for two scan signals, the number of shift registers can be reduced as compared with the number of scan lines. Thus, the size of the scan driver circuit can be reduced.

Hereinafter, pixels according to another example embodiment of the present invention will be described with reference to FIG. 9.

Figure 9:
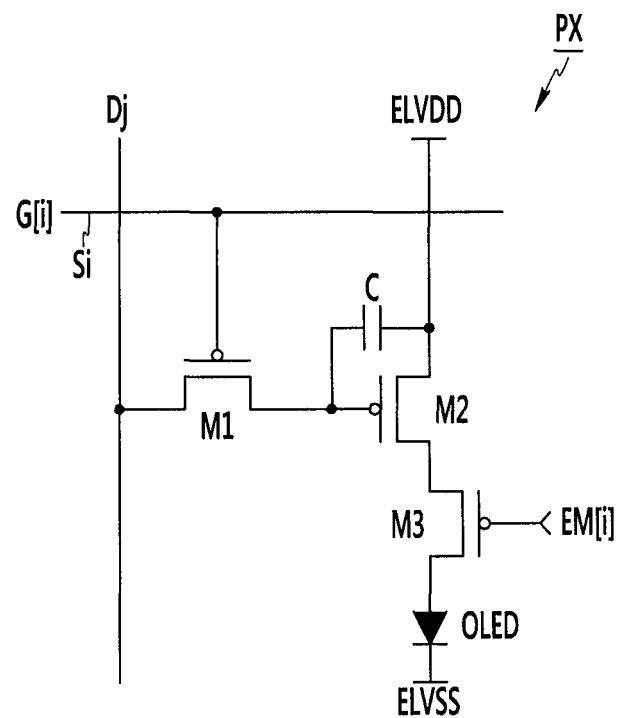
FIG. 9 is a schematic diagram of a pixel according to another example embodiment of the invention.

FIG. 9 is a schematic diagram of a pixel according to another example embodiment of the present invention.

A pixel PX is shown to be coupled to an i-th scan line Si, an i-th light emission control line EM[i], and a j-th data lines Dj. However, this structure is merely one example, and exemplary embodiments are not limited thereto.

The pixel PX includes a switching transistor M1, a driving transistor M2, a light emission transistor M3, a capacitor C, and an organic light emitting diode OLED. Since the switching transistor M1 and the light emission transistor M3 are p-channel transistors, they are turned on at a low level applied to their respective gates and turned off at a high level.

A gate of the switching transistor M1 performs a switching operation based on a scan signal G[i] transmitted through the scan line Si. When the switching transistor M1 is turned on by a scan signal G[i] of a low level, the data voltage transmitted through the data line Dj is supplied to the gate of the driving transistor M2 and is maintained by the capacitor C.

The capacitor C is coupled between a gate and a source of the driving transistor M2, and the source of the driving transistor M2 is coupled to the voltage ELVDD. A source of the light emission transistor M3 is coupled to a drain of the driving transistor M2, a light emission signal EM[i] is input to a gate of the light emission transistor M3, and a drain of the light emission transistor M3 is coupled to an anode of the organic light emitting diode OLED. A cathode of the organic light emitting diode OLED is coupled to the voltage ELVSS.

The driving transistor M2 allows a driving current therethrough according to the data voltage and the voltage ELVDD. When the light emission transistor M3 is turned on, the organic light emitting diode OLED emits light according to the driving current.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

DESCRIPTION OF SOME OF THE SYMBOLS display device 1
signal controller 10
data driver 20
scan driver 30
light emission driver 40
display unit 50
shift registers 100_1~100_4
transistors 111~116, 121~126, 131~136, 141~146, 411~419, 431~439, 451~459, 471~479, SW1~SW8, M1~M3
capacitors 117, 118, 127, 128, 137, 138, 147, 148, 421, 422, 441, 442, 461, 462, 481, 482, C
light emission shift register 40_1~40_4
organic light emitting diode OLED

What is claimed is:

1. A display device, comprising:
a light emission driver configured to sequentially generate a plurality of light emission signals having a disable level during a first period; and
a scan driver configured to generate a plurality of shift outputs, each of the plurality of shift outputs comprising two enable pulses on a same signal line during a same frame, and each of the plurality of shift outputs corresponding to two scan signals of a plurality of scan signals,
wherein the scan driver is further configured to output a first scan signal and a second scan signal in response to first and second light emission signals among the plurality of light emission signals, by dividing the two enable pulses of a first shift output among the plurality of shift outputs, which correspond to the first and second light emission signals among the plurality of light emission signals, from each other.

2. A display device, comprising:
a light emission driver configured to sequentially generate a plurality of light emission signals having a disable level during a first period; and
a scan driver configured to generate a plurality of shift outputs, each of the plurality of shift outputs comprising two enable pulses, and each of the plurality of shift outputs corresponding to two scan signals of a plurality of scan signals,
wherein the scan driver is further configured to output a first scan signal and a second scan signal in response to first and second light emission signals among the plurality of light emission signals, by dividing the two enable pulses of a first shift output among the plurality of shift outputs, which correspond to the first and second light emission signals among the plurality of light emission signals, from each other, wherein the scan driver comprises:
a shift register unit comprising a plurality of shift registers configured to generate the plurality of shift outputs, respectively; and
a demultiplexer comprising a plurality of switches, which are coupled to the plurality of shift outputs, and
wherein a third switch among the plurality of switches, which corresponds to the first shift output, is controlled by the second light emission signal, and a fourth switch among the plurality of switches, which corresponds to the first shift output, is controlled by the first light emission signal.

3. The display device of claim 2,
wherein a first shift register, among the plurality of shift registers, outputs the first shift output in response to a second shift output of a second shift register,
wherein the first shift output comprises two enable pulses synchronized with a first scan clock signal comprising two periodic enable pulses,
wherein the two enable pulses of the second shift output are synchronized with a second scan clock signal comprising two periodic enable pulses, and
wherein the second shift register is located two stages before the first shift register.

4. The display device of claim 3, wherein the first scan clock signal and the second scan clock signal have a half-period phase difference therebetween.

5. The display device of claim 4, wherein the first shift register comprises:
a first transistor comprising a first terminal coupled to the second shift output and a gate coupled to the second scan clock signal;
a second transistor comprising a gate coupled to a second terminal of the first transistor, a first terminal coupled to the first scan clock signal, and a second terminal coupled to an output terminal of the first shift register; and a capacitor coupled between the gate and the second terminal of the second transistor.

6. The display device of claim 5, wherein the first shift register further comprises:
a third transistor comprising a first terminal coupled to a first voltage and a second terminal coupled to the output terminal of the first shift register; and
a fourth transistor comprising a first terminal coupled to a gate of the third transistor, a gate coupled to the second shift output, and a second terminal coupled to the first voltage.

7. The display device of claim 6, wherein the first shift register further comprises:
a fifth transistor comprising a first terminal coupled to the gate of the third transistor, a gate coupled to a first initialization signal, and a second terminal coupled to a second voltage; and
a sixth transistor comprising a first terminal coupled to the first voltage and a second terminal coupled to the gate of the second transistor, and a gate coupled to the gate of the third transistor,
wherein the first initialization signal has an enable pulse generated after the two enable pulses of the first scan clock signal and before the two enable pulses of the second scan clock signal.

8. The display device of claim 3,
wherein, during a period when the fourth switch is turned off by a disable level of the first light emission signal, a first enable pulse of the two enable pulses of the first shift output is output as the first scan signal through the third switch, and
wherein, during a period when the third switch is turned off by a disable level of the second light emission signal, a second enable pulse of the two enable pulses of the first shift output is output as the second scan signal through the fourth switch.

9. The display device of claim 8, wherein the disable level of the first light emission signal and the disable level of the second light emission signal do not overlap each other, and
wherein the light emission driver generates a third light emission signal having a disable-level overlapping the disable level of the first light emission signal and the disable level of the second light emission signal.

10. The display device of claim 3, further comprising:
a third shift register a stage after the first shift register among the plurality of shift registers is configured to output a third shift output in response to a fourth shift output of a fourth shift register,
wherein the fourth shift output comprises two enable pulses synchronized with a third scan clock signal comprising two periodic enable pulses,
wherein the third shift output is synchronized with a fourth scan clock signal having two periodic enable pulses, and wherein the fourth shift register is two stages before the third shift register.

11. The display device of claim 10, wherein the third scan clock signal and the fourth scan clock signal have a half-period phase difference therebetween.

12. The display device of claim 11, wherein the first scan clock signal and the fourth scan clock signal have a ⅛-period phase difference therebetween, and the second scan clock signal and the third scan clock signal have a ⅛-period phase difference therebetween.

13. The display device of claim 10, wherein the scan driver is configured to output third and fourth scan signals in response to third and fourth light emission signals among the plurality of light emission signals, by dividing two enable pulses of the third shift output from each other.

14. The display device of claim 13, wherein a fifth switch among the plurality of switches, which corresponds to the third shift output, is controlled by the fourth light emission signal, and a sixth switch among the plurality of switches, which corresponds to the third shift output, is controlled by the third light emission signal.

15. The display device of claim 14,
wherein, during a period when the sixth switch is turned off by a disable level of the third light emission signal, one of the two enable pulses of the third shift output is output as the third scan signal through the fifth switch, and
wherein, during a period when the fifth switch is turned off by a disable level of the fourth light emission signal, the other of the two enable pulses of the third shift output is output as the fourth scan signal through the sixth switch.

16. The display device of claim 15, wherein the disable level of the third light emission signal and the disable level of the fourth light emission signal do not overlap each other, and
wherein the light emission driver generates the first light emission signal having a disable level overlapping the disable level of the third light emission signal and the disable level of the fourth light emission signal.

17. The display device of claim 15, wherein the first, second, third, and fourth light emission signals have disable levels that occur in order of first, fourth, second, and then third.

18. A display device, comprising:
a light emission driver configured to sequentially generate a plurality of light emission signals having a disable level during a first period; and
a scan driver configured to generate a plurality of shift outputs, each of the plurality of shift outputs comprising two enable pulses, and each of the plurality of shift outputs corresponding to two scan signals of a plurality of scan signals,
wherein the scan driver is further configured to output a first scan signal and a second scan signal in response to first and second light emission signals among the plurality of light emission signals, by dividing the two enable pulses of a first shift output among the plurality of shift outputs, which correspond to the first and second light emission signals among the plurality of light emission signals, from each other,
wherein the light emission driver comprises:
a first light emission shift register, and
a second light emission shift register being one stage before the first light emission shift register,
wherein when the first light emission shift register receives a second light emission shift output of the second light emission shift register at an enable level concurrently with a first light emission clock signal having an enable level, the first light emission shift register is configured to output a first light emission shift output at a disable level, and
wherein when the first light emission shift register receives a first inverted light emission clock signal at an enable level concurrently with the second light emission shift output at an enable level, the first light emission shift register is configured to output the first light emission shift output at an enable level.

19. The display device of claim 18, wherein the light emission driver further comprises:

a third light emission shift register, wherein when the third light emission shift register receives the first light emission shift output at an enable level concurrently with a second light emission clock signal having an enable level, the third light emission shift register is configured to output a third light emission shift output at a disable level, and wherein when the third light emission shift register receives a second inverted light emission clock signal at an enable level concurrently with the first light emission shift output at an enable level, the third light emission shift register is configured to output the third light emission shift output at an enable level.

20. The display device of claim 19, wherein the first light emission clock signal and the second light emission clock signal have a ¼-period phase difference therebetween.

21. The display device of claim 18, wherein the first light emission shift register comprises:

a seventh transistor comprising a gate to which the first light emission clock signal is input, and a first terminal coupled to the second light emission shift output;

an eighth transistor comprising a gate coupled to a second terminal of the seventh transistor, and a first terminal coupled to the first inverted light emission clock signal;

a ninth transistor comprising a first terminal coupled to the second terminal of the eighth transistor, a gate coupled to the first light emission clock signal, and a second terminal coupled to a first voltage;

a first capacitor coupled between the gate and the second terminal of the eighth transistor;

a tenth transistor comprising a gate coupled to the second terminal of the eighth transistor and a first terminal coupled to a second voltage; and an eleventh transistor comprising a gate coupled to the second terminal of the tenth transistor, a first terminal coupled to the first voltage, and a second terminal coupled to an output terminal of the first light emission shift register.

22. The display device of claim 21, wherein a gate voltage of the eleventh transistor is coupled to the first light emission shift output.

23. The display device of claim 21, wherein the second light emission shift register further comprises:

a twelfth transistor comprising a gate coupled to the second terminal of the eighth transistor and a first terminal coupled to the first voltage; and a thirteenth transistor comprising a gate coupled to the first light emission clock signal, a first terminal coupled to a second terminal of the twelfth transistor, and a second terminal coupled to the second voltage;

a fourteenth transistor comprising a gate coupled to the second terminal of the twelfth transistor, a first terminal coupled to the second voltage, and a second terminal coupled to the output terminal of the first light emission shift register; and a second capacitor coupled between the gate and the second terminal of the fourteenth transistor.

24. The display device of claim 23, wherein the second light emission shift register further comprises:

a fifteenth transistor comprising a first terminal coupled to the first voltage, a second terminal coupled to the gate of the eleventh transistor, and a gate coupled to the second terminal of the thirteenth transistor.

* * * * *